(12) United States Patent
Alaus et al.

(10) Patent No.: US 8,938,034 B2
(45) Date of Patent: Jan. 20, 2015

(54) PROCESSOR FOR PROCESSING DIGITAL DATA WITH BUTTERFLY OPERATOR FOR THE EXECUTION OF AN FFT/IFFT AND TELECOMMUNICATION DEVICE

(75) Inventors: Laurent Alaus, Grenoble (FR); Dominique Noguet, Saint Siméon de Bressieux (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/511,672

(22) PCT Filed: Nov. 29, 2010

(86) PCT No.: PCT/FR2010/052565
§ 371 (c)(1),
(2), (4) Date: May 24, 2012

(87) PCT Pub. No.: WO2011/064514
PCT Pub. Date: Jun. 3, 2011

(65) Prior Publication Data
US 2012/0281739 A1 Nov. 8, 2012

(30) Foreign Application Priority Data
Nov. 30, 2009 (FR) ...................................... 09 58495

(51) Int. Cl.
*H04L 27/06* (2006.01)
*G06F 17/14* (2006.01)
(Continued)

(52) U.S. Cl.
CPC ......... *G06F 17/142* (2013.01); *H03M 13/3961* (2013.01); *H03M 13/4107* (2013.01); *H03M 13/6511* (2013.01)

USPC ........................... 375/341; 714/786; 714/795

(58) Field of Classification Search
USPC .................................. 375/341; 714/786, 795
See application file for complete search history.

(56) References Cited

U.S. PATENT DOCUMENTS

2009/0106341 A1  4/2009 Al Adnani

FOREIGN PATENT DOCUMENTS

EP          1 758 030         2/2007

OTHER PUBLICATIONS

Chul Y. Jung, Myung H. Sunwoo, and Seong K. Oh, Design of Reconfigurable Coprocessor for Communication Systems, IEEE 2004.*

(Continued)

*Primary Examiner* — Tanmay Shah
(74) *Attorney, Agent, or Firm* — Oblon, Spivak, McClelland, Maier & Neustadt, L.L.P.

(57) ABSTRACT

A processor for processing digital data includes at least one butterfly operator for executing an FFT/IFFT computation. This butterfly operator contains a first stage of complex multiplication and a second stage of complex addition and subtraction. Each of these two stages contains a plurality of addition/subtraction hardware modules and data transmission links between these modules. At least a part of the addition/subtraction modules of each stage of the butterfly operator and at least a part of the links between these modules are configurable with the aid of at least one programmable parameter, between a first configuration in which the butterfly operator carries out said fast Fourier transform computation and a second configuration in which the butterfly operator carries out a computation of branch metrics values and of path metrics and survivors values of a Viterbi algorithm.

11 Claims, 5 Drawing Sheets (51) Int. Cl.
*H03M 13/39* (2006.01)
*H03M 13/41* (2006.01)
*H03M 13/00* (2006.01)

(56) References Cited

OTHER PUBLICATIONS

U.S. Appl. No. 13/702,769, filed Dec. 7, 2012, Noguet, et al.

Jung, C.Y., et al., "Design of Reconfigurable Coprocessor for Communication Systems," IEEE Workshop on Signal Processing Systems, pp. 142-147, (Oct. 13-15, 2004).

Lee, J., et al., "A DSP Architecture for High-Speed FFT in OFDM Systems," ETRI Journal, vol. 24, No. 5, pp. 391-397, (Oct. 2002).

Wenzler, A., et al., "New Structures for Complex Multipliers and their Noise Analysis," Proceedings of the 1995 IEEE Interntional Symposium on Circuits and Systems, pp. 1432-1435, (Apr. 30-May 3, 1995).

Jaervinen, T., et al., "Unified Architecture for Discrete Fourier and Inverse Cosine Transforms," Proceedings of the $5^{th}$ WSES International Conference on Circuits, Systems, Communications and Computers, Total 6 Pages, (Jul. 8-15, 2001).

Lange, H., et al., "Reconfigurable Multiply-Accumulate-based Processing Element," Proceedings of the 2002 IEEE Workshop on Heterogeneous Reconfigurable Systems on Chip, pp. 1-4, (Apr. 25, 2002).

Huang, Y.H., et al., "A 1.1 G MAC/s Sub-Word-Parallel Digital Signal Processor for Wireless Communication Applications," IEEE Journal of Solid-State Circuits, vol. 39, No. 1, pp. 169-183, (Jan. 2004).

Hangpei, T., et al., "Gaining Flexibility and Performance of Computing Using Tailored Instruction Set and Reconfigurable Architecture," 2008 International Conference on Mutlimedia and Ubiquiious Engineering, pp. 324-329, (Apr. 24-26, 2008).

Alaus, L., et al., "Promising Technique of Parameterization for Reconfigurable Radio, the Common Operators Technique: Fundamentals and Examples," Journal of Signal Processing Systems, Total 13 Pages, (Mar. 14, 2009).

Lee, H., et al., "A Low Power DSP for Wireless Communications," IEEE Transactions on Very Large Scale Integration (VLSI) Systems, vol. 18, No. 9, Total 13 Pages, (Aug. 25, 2010).

Naoucs, M., et al., "A Common Operator for FFT and Viterbi algorithms," $13^{th}$ Euromicro Conference on Digital System Design: Architectures, Methods and Tools, pp. 309-313, (Sep. 1, 2010).

Alaus, L., et al., "Architecture reconfigurable pour un equipement radio multistandard," Version 1, Total 3 Pages, (Nov. 25, 2010).

International Search Report Issued May 11, 2011 in PCT/FR10/52565 Filed Nov. 29, 2010.

U.S. Appl. No. 13/512,046, filed May 25, 2012, Alaus, et al.

\* cited by examiner

PROCESSOR FOR PROCESSING DIGITAL DATA WITH BUTTERFLY OPERATOR FOR THE EXECUTION OF AN FFT/IFFT AND TELECOMMUNICATION DEVICE

This invention concerns a digital data processor for the execution of a direct Fast Fourier Transform (FFT) computation, or an Inverse Fast Fourier Transform computation (IFFT). It also concerns a telecommunication terminal containing at least one such processor.

A processor of this type can be used in a large number of telecommunications applications, especially in multi-carrier modulation/demodulation terminals for both received and emitted signals. With this type of terminal, the modulation/demodulation generally and advantageously brings in a digital FFT/IFFT computation, notably for Software Defined Radio or Reconfigurable Radio (SDR).

A SDR emitting/receiving terminal is a terminal in which the digital/analog conversion is carried out closest to the antenna, such that modulation/demodulation and encoding/decoding processing executed by the terminal is done on digital signals. These digital signals work better with a reconfigurable process, i.e. one that is capable of adapting to different standards or to different evolutions.

At present, there are numerous wireless communication standards in existence. An immediate consequence of this proliferation of standards is the growing need for terminals capable of managing different standards. The signal processors currently available have limited computation capacities and use large amounts of electricity, resulting in a solution that is inadequate for fully meeting requirements. Consequently, a pure software solution is not viable and it is necessary to use hardware operators.

One first solution for managing several standards consists in juxtaposing the various processing chains for the various standards into one terminal, with each one having its own hardware operators. This solution is simple to put into operation, but presents the major disadvantage of not being efficient in terms of the silicon surface used.

Another solution consists in conceiving different processing chains in such a manner that they pool a part of their functional modules and hardware operators. This second solution calls for parameterization of the terminal to reconfigure it so that executing one processing chain or another requires only a single change in parameter values. A common operator technique is presented in an article by L. Alaus and others, titled "Promising Technique of Parametrization for Reconfigurable Radio, the Common Operators Technique : Fundamentals and Examples", published in the Journal of Signal Processing Systems, DOI 10.1007/ s11265-009-0353-04, 14 Mar. 2009.

As an example, this article argues that a common FFT/IFFT computation equipment operator can be advantageously used because it is solicited by a large number of standards. Indeed, most current or in progress telecommunications standards are based on Orthogonal Frequency Division Multiplexing (OFDM) modulations. OFDM modulation is a encoding process for digital signals that divides them into orthogonal frequencies. The principle of OFDM modulation consists in multiplexing communication data by dividing it among sub channels simultaneously on independent frequencies. The core of an OFDM modulation contains an FFT computation.

The FFT operator comes into play more generally as a base operator of signal reception functions in the frequency domain. For example, an FFT operator is used in a frequency implementation of a channel estimate by equalization in a multi-carrier signal modulation/demodulation and in executing a function known as channelization, i.e. selecting a channel, in a filter bank. This operator can therefore be used at different levels of a processing chain and under different standards. With this, it is possible to conceive a reconfigurable terminal that features a limited number of hardware operators for FFT computation.

The invention concerns more precisely a processor with at least one butterfly operator that fulfills this FFT operator function using a Cooley-Tukey algorithmic approach in a Radix 2 subdivision. Such a processor is for example described in the European patent application published under number EP 1 583 533. In general, the implementation of this type of processor with butterfly operator(s) requires that each butterfly operator contains a first stage of complex multiplication and a second stage of complex addition and subtraction that receives output data from the first stage, with each of the two stages containing a plurality of addition/subtraction hardware modules and data transmission links between these modules. The first stage of complex multiplication furthermore contains multiplication hardware modules.

These hardware modules are specific to the aforementioned implementation of the FFT operator. In particular, as the FFT operator is not used for channel encoding/decoding, which is, in addition to modulation/demodulation, another essential function of emitting/receiving terminals in telecommunication, other hardware modules must be added to complete channel encoding.

However, the majority of standards require a channel encoding process to ensure reliability of transmitted data. Channel encoding combats disruptions brought on by the transmitting channel by replacing the message being transmitted with a less vulnerable message, for example, by encoding this message with a convolutional encoder. The Viterbi algorithm is then a technique generally used for decoding signals processed by a convolutional code.

Implementing this technique in an SDR emitting/receiving terminal significantly increase its complexity because it requires dedicated hardware modules and processors.

It would then be desirable to have a digital data processor that can at least partially resolve the abovementioned issues and constraints and/or improve the reconfiguration capabilities of a terminal.

An object of the invention is therefore a processor for processing digital data comprising at least one butterfly operator for the execution of a fast Fourier transform computation, this butterfly operator containing a first stage of complex multiplication and a second stage of complex addition and subtraction that receives output data from the first stage, with each of the two stages containing a plurality of addition/subtraction hardware modules and data transmission links between these modules, a processor wherein at least a part of the addition/subtraction modules of each stage of the butterfly operator and at least a part of the links between these modules is configurable with the aid of at least one programmable parameter, between a first configuration in which the butterfly operator carries out said fast Fourier transform computation and a second configuration in which the butterfly operator carries out a computation of branch metrics values and of path metrics and survivors values of a Viterbi algorithm.

The original idea exploited by the invention originates with the observation that implementing FFT computation by means of butterfly operators resembles a possible implementation of a computation of branch metrics values and of path metrics and survivors values of a Viterbi algorithm. This implementation of the Viterbi algorithm with a butterfly scheme reveals the possibility of sharing several addition/ subtraction hardware modules used in the stages of complex multiplication and subtraction of an FFT computation processor with butterfly operators. Thus, by parametrizing these addition/subtraction modules and links with each other, it becomes possible to conceive a single processor for processing digital data capable through parametrization of performing FFT computations with Radix 2 butterfly operators and computations of branch metrics values and of path metrics and survivors values of a Viterbi algorithm. The modulation/demodulation and channel encoding/decoding functions can thus be accomplished in the same terminal using common hardware operators, limiting the number and size of hardware components that need to be placed inside the terminal.

Furthermore, as the FFT computation is carried out on complex data, the obtained processor, which may be configured between an FFT computation and a computation of branch metrics values and of path metrics and survivors values of a Viterbi algorithm, is capable of processing either hard binary input data or soft data encoded on several bits to accomplish the Viterbi decoding.

Optionally, the first stage of complex multiplication contains a first level of real addition/subtraction of input data, a second level of real multiplications carried out using data from the first level and a third level of real addition/subtraction carried out using data from the second level, with at least a part of the addition/subtraction modules of the first level of the first stage of complex multiplication and at least a part of the links going to or leaving from these modules able to be configured using at least one programmable parameter between a first configuration in which the first level of the first stage of complex multiplication carries out prior addition and/or subtraction operations set up to limit the number of real multiplications to execute at the second level, and a second configuration in which a computation of branch metrics values and of path metrics and survivors values of a Viterbi algorithm is carried out.

This configuration optimizes the number of hardware modules that may be shared for the two computations, FFI/IFFT on one hand and Viterbi on the other.

Also optionally, the first level of the first stage of complex multiplication contains four hardware modules for addition and/or subtraction, and the second level of complex multiplication contains three hardware modules for real multiplication.

Also optionally, the configurable addition/subtraction modules are configured using a single binary parameter between an adder configuration and a subtractor configuration.

Also optionally, configurable links contain dual input multiplexers with a single output and with a selection of one of the two inputs using the said single binary parameter.

Also optionally, a processor for processing digital data according to the invention contains:
 a first operator with three combined addition/subtraction modules that can be configured using at least one programmable parameter between a first configuration in which this first operator carries out computations of real parts of coefficients involved in the computation of a fast Fourier transform and a second configuration in which a first computation of branch metrics values and of path metrics and survivors values of a Viterbi algorithm is carried out.
 a second operator, different from the first, with three combined addition/subtraction modules that can be configured using at least one programmable parameter between a first configuration in which this second operator carries out computations of imaginary parts of coefficients involved in the computation of a fast Fourier transform and a second configuration in which a second computation of branch metrics values and of path metrics and survivors values of a Viterbi algorithm is carried out.

Also optionally, a processor for processing digital data according to the invention contains a plurality of butterfly operators that can be configured between the said first configuration in which each butterfly operator carries out the said fast Fourier transform and the said second configuration in which each butterfly operator carries out a computation of branch metrics values and of path metrics and survivors values of a Viterbi algorithm, these butterfly operators being structured among themselves such that they can perform a fast Fourier transform computation by means of a trellis structure Radix 2 Cooley-Tukey algorithmic approach, and for a trellis implementation of the Viterbi algorithm with four reference symbols.

Another object of the invention is a telecommunication terminal with multi-carrier modulation/demodulation of both received and emitted signals that decodes signals processed by means of a convolutional code, containing at least one processor for processing digital data as described above.

Optionally, a telecommunication terminal according to the invention implements an OFDM modulation/demodulation.

Also optionally, a telecommunication terminal according to the invention, is of a multi-standards type, containing at least one modulator/demodulator that implements an OFDM modulation and demodulation and that is compatible with each implemented standard, and at least one decoder of signals encoded by a convolutional code compatible with each implemented standard.

The invention will be better understood with the aid of the following description, which is provided solely for the purposes of providing an example and is done with reference to the appended drawings, as follows.

The direct fast Fourier transform is a computation algorithm of the discrete Fourier transform. This algorithm is used to process digital signals to transform discrete data from the temporal or spatial domain to that of frequencies.

Take for example, N discrete temporal values x[0], ..., x[N−1] of a signal x. The N frequency values of discrete Fourier transform X of this signal x are determined through the following formula:

$$X[k] = \sum_{n=0}^{N-1} x[n] \cdot w^{kn}, \text{ for } k = 0, \ldots, N-1,$$

where $w = e^{-i\frac{2\pi}{N}}$.

As the inverse discrete Fourier transform is equivalent to the direct discrete Fourier transform, apart from a sign and 1/N factor, the inverse fast Fourier transform IFFT uses the same algorithm as the FFT to compute this inverse discrete Fourier transform. Therefore, all processors for processing digital data configured to compute a direct fast Fourier transform are also capable of computing an inverse fast Fourier transform.

A particularly simple and widely used implementation of the FFT computation is the Cooley-Tukey algorithm using Radix 2 subdivisions. It assumes that the number N of transformed samples is a power of 2 and recursively subdivides the processing of n samples into two identical processing loads of equal size n/2 at a lower level. Indeed, at a first level, we get:

$$X[k] =$$

$$\sum_{n=0}^{N-1} x[n] \cdot e^{-i\frac{2\pi}{N}nk} = \sum_{n=0}^{N/2-1} x[2n] \cdot e^{-i\frac{2\pi}{N}2nk} + \sum_{n=0}^{N/2-1} x[2n+1] \cdot e^{-i\frac{2\pi}{N}(2n+1)k},$$

$$X[k] = \sum_{n=0}^{N/2-1} x[2n] \cdot e^{-i\frac{2\pi}{N/2}nk} + e^{-i\frac{2\pi}{N}k} \sum_{n=0}^{N/2-1} x[2n+1] \cdot e^{-i\frac{2\pi}{N/2}nk},$$

$$X[k] = \sum_{n=0}^{N/2-1} x[2n] \cdot e^{-i\frac{2\pi}{N/2}nk} + w^k \sum_{n=0}^{N/2-1} x[2n+1] \cdot e^{-i\frac{2\pi}{N/2}nk}$$

On a recurring basis, an FFT computation at a given level is done through two FFT computations at a lower level, one for even samples, the other for odd samples of the signal at said given level.

Figure 1:
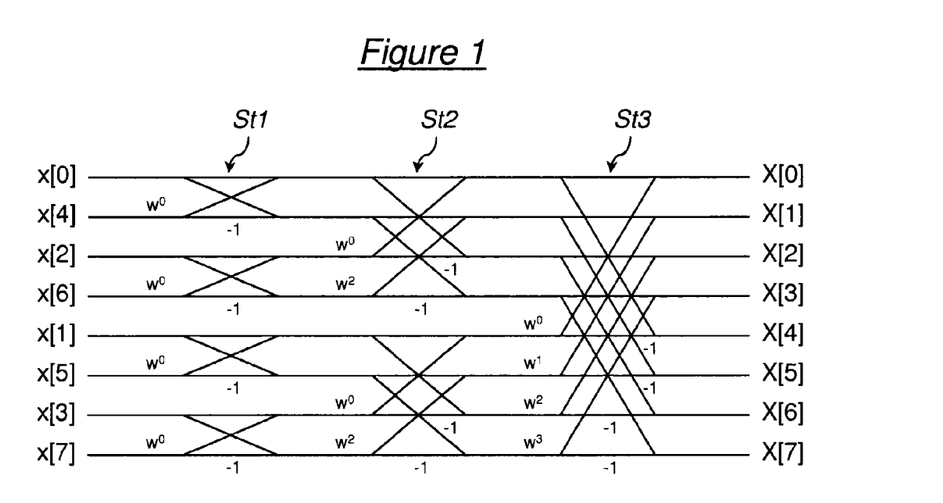
FIG. 1 is a schematic representation of the overall structure of a data processing trellis system for implementing an FFT/IFFT computation through a Cooley-Tukey algorithm with a Radix 2 subdivision, FIG. 2 schematically represents the structure of a butterfly operator used by the data processing system in FIG. 1.

By using additional well known simplifications, we get a trellis processing at several scales or levels, involving the same number of successive steps, as shown in FIG. 1 for N=8 involving three steps, St1, St2 and St3.

Figure 2:
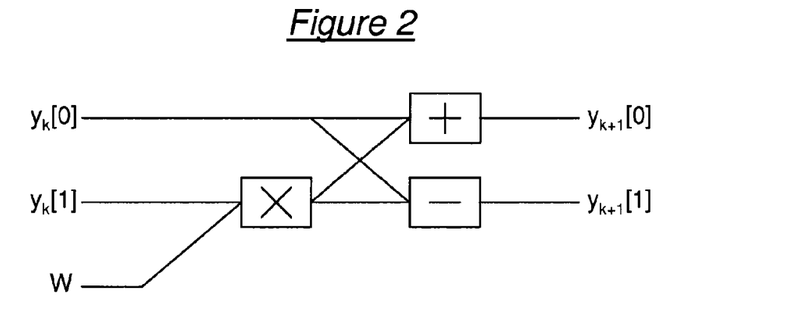

Each step contains N/2 butterfly computations, for a total number of $N/2 \times \log_2(N)$ butterfly computations, as the one illustrated in FIG. 2. This butterfly computation requires cross calculations of two data $y_k[0]$ and $y_k[1]$, containing a complex multiplication of one of these data, $y_k[1]$, by a factor W to furnish an intermediate value, then complex addition and subtraction between $y_k[0]$ and the intermediate value to provide two data $y_{k+1}[0]$ and $y_{k+1}[1]$. In the example shown in FIG. 1, the W factor's value is $w^0$ at level/step St1, $w^0$ or $w^2$ at level/step St2 and $w^0$, $w^1$, $w^2$ or $w^3$ at level/step St3.

The two relationships linking $y_{k+1}[0]$ and $y_{k+1}[1]$ to $y_k[0]$ and $y_k[1]$ take the following form:

$y_{k+1}[0]=y_k[0]+W \cdot y_k[1],$ $y_{k+1}[1]=y_k[0]-W \cdot y_k[1].$

In practice, the butterfly computation is carried out by an operator which is structured in an initial complex multiplication stage and a second stage of complex subtraction and addition receiving data output by the first stage. To carry out its complex multiplication, the first stage contains hardware modules for real multiplication, hardware modules for real addition/subtraction and links for data transmission between these modules. To carry out complex addition and subtraction, the second stage contains real addition/subtraction hardware modules and links for data transmission to these modules.

More precisely, noting:

$y_k[1]=a+ib,$ $W=c+id,$ $y_k[0]=e+if,$

Where a, b, c, d, e and f are real values, the need appears for real multiplication, addition and subtraction hardware modules:

$y_{k+1}[0]=(ac-bd+e)+i(bc+ad+f),$ $y_{k+1}[1]=(-ac+bd+e)+i(-bc-ad+f).$

Figure 3:
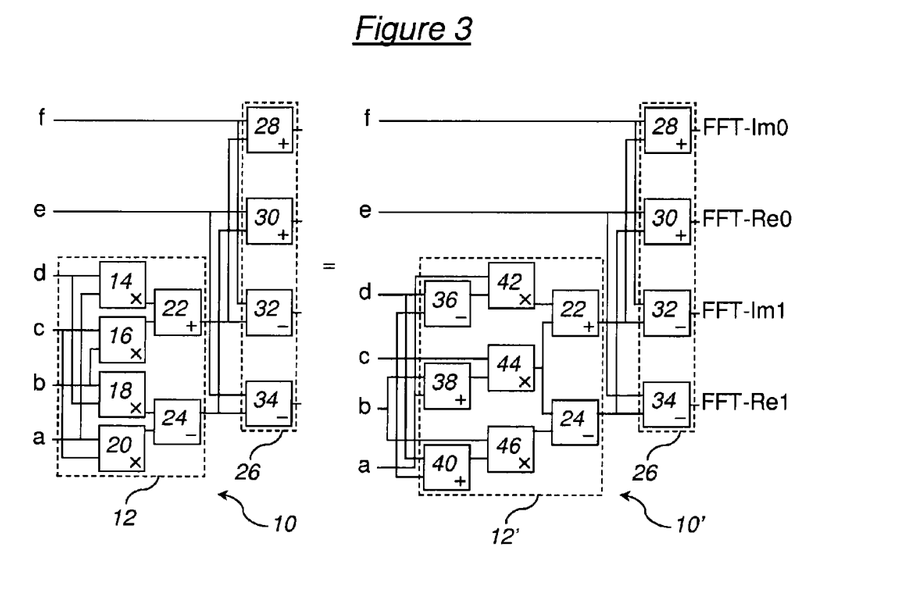
FIG. 3 is a schematic representation of possible implementation with addition/subtraction and multiplication modules of the butterfly operator in FIG. 2.

In this simple form, the computation carried out by a butterfly operator requires four real multiplication hardware modules, three real addition hardware modules and three real subtraction hardware modules, as represented on the left side of FIG. 3.

More precisely, the first stage of complex multiplication of the butterfly operator 10 which is represented on the left side of FIG. 3, having reference sign 12, contains four multiplication modules 14, 16, 18 and 20 that respectively produce products ad, bc, bd and ac, an addition module 22 receiving output data from modules 14 and 16 to compute the sum of ad+bc and a subtraction module 24 receiving output data from modules 18 and 20 to compute the subtraction of ac−bd.

The second complex addition and subtraction stage of the butterfly operator, having reference sign 26, contains:
  An addition module 28 receiving output data from module 22 and the variable f to carry out the operation ad+bc+f, thus providing the imaginary part marked FFt-Im0 of $y_{k+1}[0]$,
  An addition module 30 receiving output data from module 24 and the variable e to carry out the operation ac−bd+f, thus providing the real part marked FFt-Re0 of $y_{k+1}[0]$,
  A subtraction module 32 receiving output data from module 22 and the variable f to carry out the operation−ad−bc+f, thus providing the imaginary part marked FFt-Im1 of $y_{k+1}[1]$, and
  A subtraction module 34 receiving output data from module 24 and the variable e to carry out the operation bd−ac+e, thus providing the real part marked FFt-Re1 of $y_{k+1}[1]$.

In a broader form that will prove more astute later, the computation carried out by a butterfly operator may require only three real multiplication hardware modules, but then uses five real addition hardware modules and four real subtraction hardware modules, as represented on the right side of FIG. 3. This broader form expresses $y_{k+1}[0]$ and $y_{k+1}[1]$ in the following equivalent manner:

$y_{k+1}[0]=[c(a+b)-b(d+c)+e]+i[c(a+b)+a(d-c)+f],$ $y_{k+1}[1]=[-c(a+b)+b(d+c)+e]+i[-c(a+b)-a(d-c)+f].$

More precisely, the first stage 12' of complex multiplication of the butterfly operator 10' represented on the right part of FIG. 3 contains first, at a first sequential level:
  A subtraction module 36 for carrying out operation d−c,
  An addition module 38 for performing operation a+b, An addition module 40 for performing operation d+c.

Then it contains, at a second sequential level:

A multiplication module 42 receiving output data from the module 36 and the variable a for performing operation a(d−c), A multiplication module 44 receiving output data from the module 38 and the variable c for performing operation c(a+b), and A multiplication module 46 receiving output data from the module 40 and the variable b for performing operation b(d+c).

Lastly, it contains, at a third sequential level:

An addition module such as the module 22 receiving output data from modules 42 and 44 to perform the operation a(d−c)+c(a+b)=ad+bc, and An addition module such as the module 24 receiving output data from modules 44 and 46 to perform the operation c(a+b)−b(d+c)=ac−bd.

The second stage 26 of complex addition and subtraction of the butterfly operator is unchanged and provides values FFT-Im0, FFT-Re0, FFT-Im1 and FFT-Re1 as respective outputs from modules 28, 30, 32 and 34.

It appears clearly then that the two butterfly operator structures 10 and 10' shown in FIG. 3 are equivalent in terms of calculations made for carrying out an FFT computation.

Figure 4:
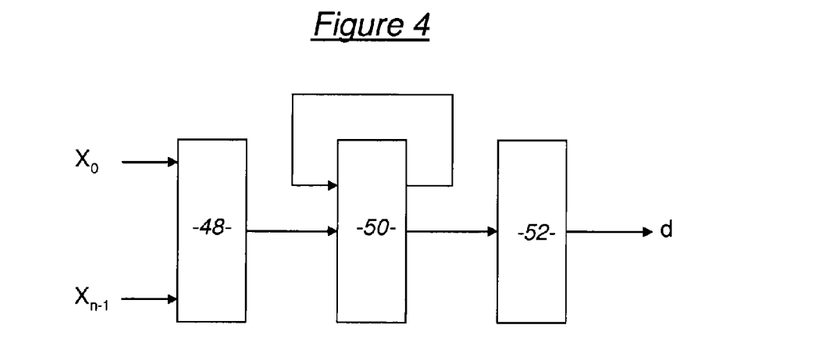
FIG. 4 is a schematic representation of the overall structure of a data processing chain for a Viterbi algorithm implementation, FIG. 5 schematically represents the structure of a butterfly operator used for a part of the data processing chain in FIG. 4.

FIG. 4 is a schematic representation of the overall structure of a data processing chain for a Viterbi algorithm implementation.

The purpose of this algorithm is to find the most probable sequence of states by recurrence that produces a measured sequence $[X_0, \ldots, X_{N-1}]$ of a signal encoded by a convolutional encoder, i.e. a shift register encoder in which each entering bit generates a shift in the register and an output result.

Its principle is to compare each value received with all the possible outputs of the shift register so as to determine what was the most probable shift of this register that generated the received value. Knowing this shift makes it possible to know the value that generated it and consequently the generating value of the message received.

For each received message value, a trellis structure is obtained that transfers all possible states of the shift register on y coordinates and all possible transitions on x coordinates, with the trellis pattern invariably repeating over time at each new encoder input. Only some binary sequences are possible in encoder output. These correspond to the different paths that exist in the trellis diagram.

The Viterbi algorithm is applied then by searching in the trellis for the binary sequence that most resembles the sequence received. In practice, the algorithm sequence contains the following three operations at each instant and for each trellis state:

Computation of branch metrics values is done in a unit 48, consisting of calculating, upon reception of N symbols (for a yield of 1/N), values representing the likelihood of symbols received with relation to the possible $2^n$ symbols. These $2^n$ values are called the branch metrics and are noted as Bm00, Bm01, Bm10 and Bm11 for N=2;

Calculating path metrics and survivors values is done in a unit 50, consisting of determining the most probable state of the shift register. For each trellis node, a path metric representing the accumulated probability of this node being part of the emitted sequence is updated by acknowledging the path metric calculated in the previous cycle and values of current branch metrics. This update contains the calculation of two path metrics and selects the lowest (survivor path);

Memorization of the decision bit taken by a unit 52 in order to restore the decoded signal at the end of frame by a technique of survivors recovery.

Specifically, the unit 48 calculates the difference between a received value and possible outputs of the shift register.

The unit 50 generally known as the Add Compare Select (ACS) unit carries out additions of two path metrics with the branch metrics for each trellis node, a comparison of the two path metrics obtained and a selection of the lowest.

Figure 5:
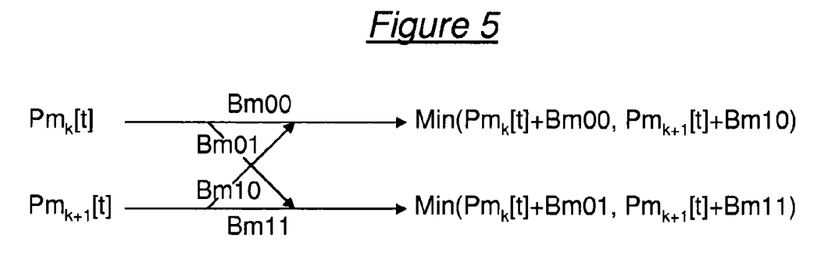

For a computing performed on the basis of four possible branch metrics Bm00, Bm01, Bm10 and Bm11 calculated by the unit 48, we can bring up a butterfly operator such as that shown in FIG. 5 to calculate the following path metrics:

$$Pm_k[t+1]=Vit0=\mathrm{Min}(Pm_k[t]+Bm00, Pm_{k+1}[t]+Bm10),$$

$$Pm_{k+N/2}[t+1]=Vit1=\mathrm{Min}(Pm_k[t]+Bm01,Pm_{k+1}[t]+Bm11).$$

Knowing that the detection of a minimum by comparing two values can be accomplished using a subtractor coupled to a multiplexer, to achieve the calculations in units 48 and 50, which are calculations of branch metrics values, branch path metrics and survivors values of the Viterbi algorithm, we note that the butterfly operator requires:

Two addition hardware modules and one subtraction hardware module for each of the calculations of path metrics and survivors values, Four additional subtraction hardware modules for calculating the four branch metrics values Bm00, Bm01, Bm10 and Bm11.

Figure 6:
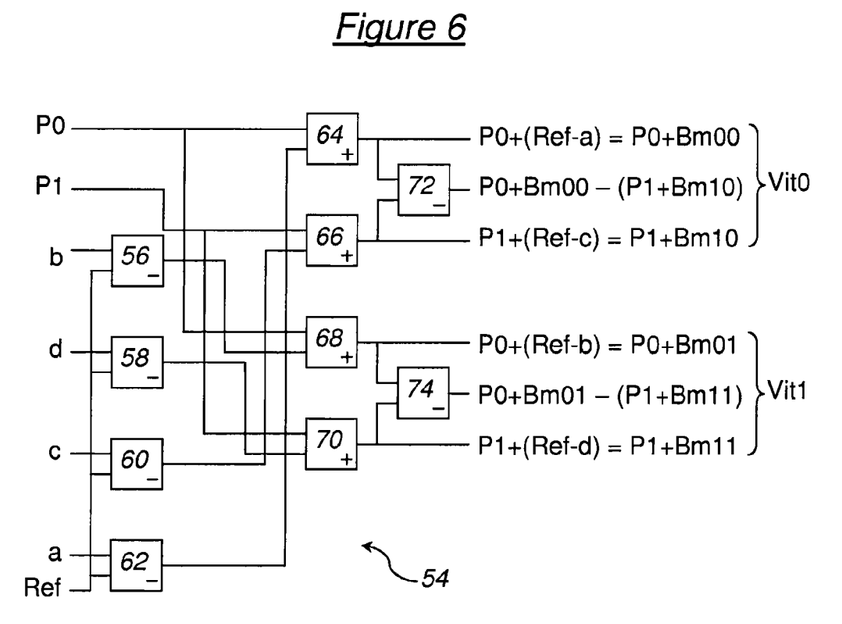
FIG. 6 is a schematic representation of possible implementation with addition/subtraction modules of the butterfly operator in FIG. 5, FIGS. 7A and 7B illustrate the configurable pooling of a part of the addition/subtraction modules of the implementations in FIGS. 3 and 6.

In all, ten addition/subtraction hardware modules are used for this butterfly operator, as shown in FIG. 6. If we call the two path metrics calculated in the previous cycle P0 and P1, Ref as the received value and a, b, c and d as the four possible output values, then the butterfly operator 54 shown in FIG. 6 has the following in its first sequential level:

Four subtraction modules 56, 58, 60 and 62 to carry out the following operations respectively, Ref-b=Bm01, Ref-d=Bm11, Ref-c=Bm10 and Ref-a=Bm00, And, in its second sequential level:

One addition module 64 receiving output from module 62 and the P0 variable to carry out the P0+Bm00 operation, One addition module 66 receiving output from module 60 and the P1 variable to carry out the P1+Bm10 operation, One addition module 68 receiving output from module 56 and the P0 variable to carry out the P0+Bm01 operation, and One addition module 70 receiving output from module 58 and the P1 variable to carry out the P1+Bm11 operation, And, in its third sequential level:

One subtraction module 72 receiving output data from modules 64 and 66 for a comparison of P0+Bm00 and P1+Bm10, to be used to determine the value of Vit0, and One subtraction module 74 receiving output data from modules 68 and 70 for a comparison of P0+Bm01 and P1+Bm11, to be used to determine the value of Vit1.

It is apparent that the butterfly structures of FFT butterfly operators 10 and 10' on one hand, and the Viterbi operator 54 on the other hand, involve hardware configurations that make it possible to pool a part of their hardware modules for addition/subtraction and links between these modules, by means of parametrizing certain addition/subtraction modules and links using for instance multiplexers.

In particular, the set made up of the third level of the first stage of complex multiplication, modules 22 and 24, associated with the second stage of complex addition and subtraction, common to FFT butterfly operators 10 and 10', presents two groups of three addition/subtraction hardware modules (with modules 22, 28 and 32 in the first group and modules 24, 30 and 34 in the second group), as with the set made up of the second and third levels of the Viterbi operator 54 (with modules 64, 66 and 72 in the first group, and modules 68, 70 and 74 in the second group).

Even better, the first level of the first stage of complex multiplication (modules 36, 38 and 40) of FFT butterfly operator 10' contains three addition/subtraction hardware modules that can be used through parametrization for the first level of the Viterbi operator 54 (modules 56, 58, 60 and 62).

Figure 7A:
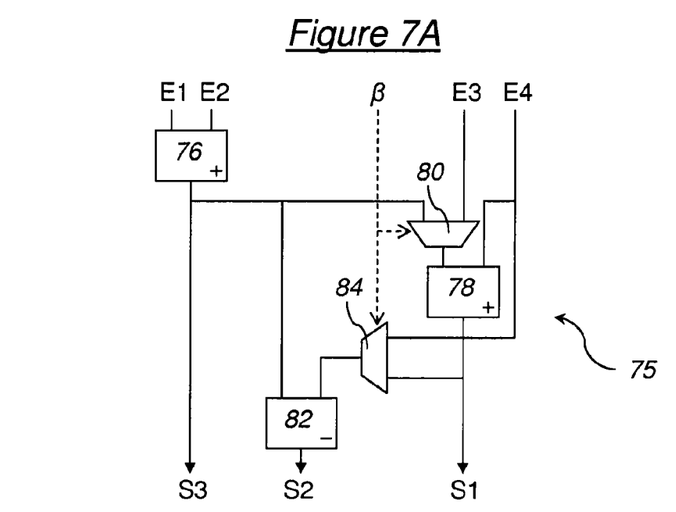

Firstly, FIG. 7A shows a possible pooling of modules 22, 28 and 32 on the one hand, and of modules 64, 66 and 72 on the other hand. This pooling of hardware resources appears in a common mathematical representation of the respective inputs and outputs of the two three-module sets under consideration.

Thus, considering modules 64, 66 and 72 of the Viterbi operator 54, noting E1 (Ref-c) and E2 (P1) as the two inputs of addition module 66, noting E3 (Ref-a) and E4(P0) as the two inputs of addition module 64, S1 (P0+Bm00) as the output of addition module 64, S2 (P0+Bm00-(P1+Bm10)) as the output of subtraction module 72 and S3 (P1+Bm10) as the output of addition module 66, we get the following set of relationships:

$$\begin{cases} S1 = E3 + E4, \\ S2 = S1 - S3, \\ S3 = E1 + E2. \end{cases}$$

Considering now modules 22, 28 and 32 of FFT butterfly operator 10 or 10', noting E1 (bc for operator 10 or c(a+b) for operator 10'), and E2 (ad for operator 10 or a(d−c) for operator 10') as the two inputs of addition module 22, E4 (f) as one of two inputs of addition module 28 or of subtraction module 32, with the other as the output of addition module 22, S1 (FFT-Im0) as the output of addition module 28, S2 (FFT-Im1) as the output of subtraction module 32 and S3 as the output of addition module 22, we get the following set of relationships $$\begin{cases} S1 = S3 + E4, \\ S2 = E4 - S3, \\ S3 = E1 + E2. \end{cases}$$

From these two sets of relationships, we can get a third one, common to both FFT and Viterbi operators, apart from a β parameter:

$$\begin{cases} S1 = (1 - \beta)E3 + \beta S3 + E4, \\ S2 = (1 - \beta)S1 + \beta E4 - S3, \\ S3 = E1 + E2. \end{cases}$$

From this third set of relationships, the common operator 75 is determined, as shown in FIG. 7A. This operator contains an addition hardware module 76 receiving E1 and and supplying S3 (third relationship). It further contains an addition hardware module 78 receiving E4 and the output of a multiplexer 80, controlled as a function of the value of parameter β, feeding S3 (β=1) or E3 (β=0). The addition hardware module 78 feeds S1 (first relationship). Finally, it contains a subtraction hardware module 82 receiving S3 and the output of a multiplexer 84, controlled as a function of the value of parameter β, feeding E4 (β=1) or S1 (β=0). The subtraction hardware module 82 feeds S2 (second relationship).

It may be observed that the addition module 76 of common operator 75 carries out the same function as module 22 when β=1 and that of module 66 when β=0; addition module 78 of common operator 75 carries out the same function as module 28 when β=1 and that of module 64 when β=0; subtraction module 82 of common operator 75 carries out the same function as module 32 when β=1 and that of module 72 when β=0.

Figure 7B:
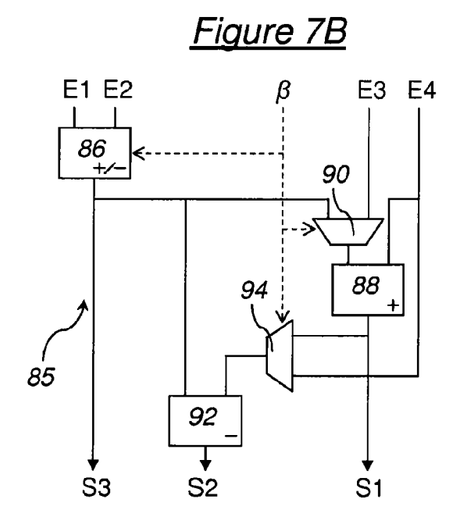

Analogously, FIG. 7B shows the possible pooling of modules 24, 30 and 34 on the one hand, and of modules 68, 70 and 74 on the other hand. This pooling of hardware resources appears in a common mathematical representation of the respective inputs and outputs of the two three-module sets under consideration.

Thus, considering modules 68, 70 and 74 of the Viterbi operator 54, noting E1 (Ref-d) and E2 (P1) as the two inputs of addition module 70, noting E3 (Ref-b) and E4 (P0) as the two inputs of addition module 68, S1 (P0+Bm01) as the output of addition module 68, S2 (P0+Bm01-(P1+Bm11)) as the output of subtraction module 74 and S3 (P1+Bm11) as the output of addition module 70, we get the following set of relationships:

$$\begin{cases} S1 = E3 + E4, \\ S2 = S1 - S3, \\ S3 = E1 + E2. \end{cases}$$

Considering now modules 24, 30 and 34 of FFT butterfly operator 10 or 10', noting E1 (bd for operator 10 or b(d+c) for operator 10'), and E2 (ac for operator 10 or c(a+b) for operator 10') as the two inputs of subtraction module 24, E4 (e) as one of the two inputs of addition module 30 (or of subtraction module 34), with the other as the output of module 24, S1 (FFT-Re0) as the output of addition module 30, S2 (FFT-Re1) as the output of subtraction module 34 and S3 as the output of subtraction module 24, we get the following set of relationships:

$$\begin{cases} S1 = S3 + E4, \\ S2 = E4 - S3, \\ S3 = -E1 + E2. \end{cases}$$

From these two sets of relationships, we can get a third one, common to both FFT and Viterbi operators, apart from the range of a β parameter:

$$\begin{cases} S1 = (1 - \beta)E3 + \beta S3 + E4, \\ S2 = (1 - \beta)S1 + \beta E4 - S3, \\ S3 = (-1)^\beta E1 + E2. \end{cases}$$

From this third set of relationships, a common operator 85 is determined as shown in FIG. 7B. This operator contains a parametrizable addition/subtraction hardware module 86 receiving E1 and E2 and supplying S3 (third relationship). More precisely, this parametrizable module 86 is designed to function as an adder (E1+E2), when β=0 and as a subtractor (E2−E1) when β=1. Furthermore, it contains an addition hardware module 88 receiving E4 and a multiplexer 90 output controlled as a function of the value of parameter β, feeding S3 (β=1) or E3 (β=0). The addition hardware module 88 feeds S1 (first relationship). Lastly, it contains a subtraction hardware module 92 receiving S3 and a multiplexer 94 output controlled as a function of the value of parameter β, feeding E4 (β=1) or S1 (β=0). The addition hardware module 92 feeds S2 (second relationship).

It may be observed that the parametrizable addition/subtraction module 86 of common operator 85 carries out the same function as module 24 when β=1 and that of module 70 when β=0; addition module 88 of common operator 85 carries out the same function as module 30 when β=1 and that of module 68 when β=0; subtraction module 92 of common operator 85 carries out the same function as module 34 when β=1 and that of module 74 when β=0.

From common operators shown in FIGS. 7A and 7B, it is possible to conceive a processor for processing digital data containing at least one parametrizable common butterfly operator (using even solely parameter β) that is capable of executing a fast Fourier transform computation in a first configuration (β=1) and a computation of branch metrics values and of path metrics and survivors values of a Viterbi algorithm in a second configuration (β=0).

Furthermore, by using the astute structure of the FFT butterfly operator 10' as a base, it is possible to pool not only addition/subtraction modules shown in FIGS. 7A and 7B, but also addition/subtraction modules of the first level of the first stage of complex multiplication (modules 36, 38 and 40) of FFT butterfly operator 10' and those of the first level of the Viterbi operator 54 (modules 56, 58, 60 and 62).

Figure 8:
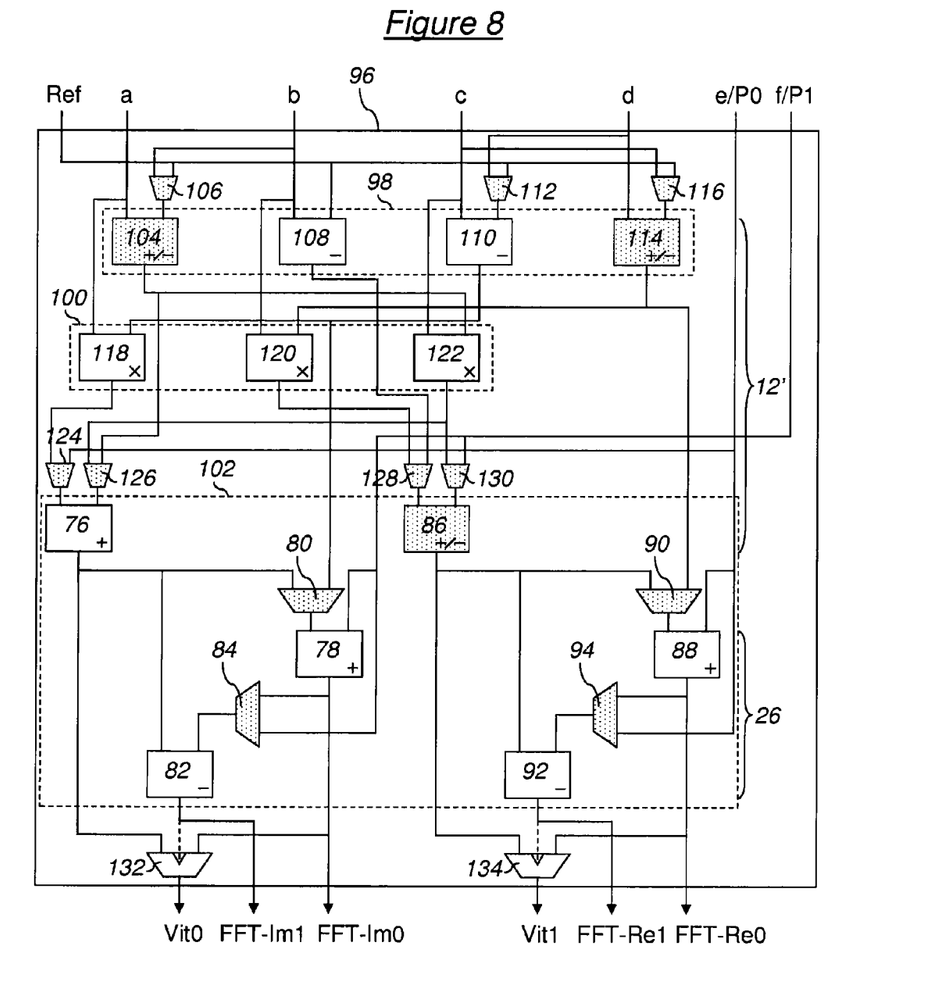
FIG. 8 is a schematic representation of the overall structure of a butterfly operator processor according to an embodiment of the invention.

Thus we get the digital data processor 96 represented schematically in FIG. 8.

This digital data processor 96 contains three sequential levels of multiplication or addition/subtraction modules.

At its first level 98, it contains four independent addition/subtraction hardware modules. This first level is common to the first level—carrying out the function of unit 48—of the Viterbi operator 54 and to the first level of the first stage of complex multiplication of the FFT butterfly operator 10'. Three addition/subtraction hardware modules of this first level 98 are common to FFT and Viterbi computations, and one is dedicated to Viterbi computation.

At a second level 100, it contains three multiplication hardware modules dedicated solely to FFT computation.

At a third level 102, it contains the two operators shown in FIGS. 7A and 7B. This third level is common to the second and third levels—carrying out the function of unit 50—of the Viterbi operator 54, and to the combination of the third level of the first stage of complex multiplication and the second stage of complex addition and subtraction of the FFT butterfly operation 10'.

More precisely, the first level 98 contains parametrizable addition/subtraction hardware module 104 receiving value a and the output of a multiplexer 106 controlled as a function of the value of parameter β, feeding b (β=1) or Ref (β=0). More precisely, this parametrizable module 104 is designed to function as an adder when β=1 and as a subtractor when β=0. Thus it supplies a+b when β=1 and Ref-a when β=0.

The first level 98 furthermore contains a subtraction hardware module 108 receiving b and Ref to supply Ref-b.

The first level 98 furthermore contains a subtraction hardware module 110 receiving value c and the output of a multiplexer 112 controlled as a function of the value of parameter β, feeding d (β=1) or Ref (β=0). This module 110 thus supplies d−c when β=1 and Ref-c when β=0.

Lastly, the first level 98 contains a parametrizable addition/subtraction hardware module 114 receiving value d and the output of a multiplexer 116 controlled as a function of the value of parameter β, feeding c (β=1) or Ref (β=0). More precisely, this parametrizable module 114 is designed to function as an adder when β=1 and as a subtractor when β=0. Thus it supplies c+d when β=1 and Ref-d when β=0.

The second level 100, used solely for FFT computation (β=1), contains:

A first multiplication hardware module 118 receiving value a and the output of the subtraction module 110 to supply the value a(d−c), when β=1, A second multiplication hardware module 120 receiving value b and the output of the parametrizable addition/subtraction module 114 to supply the value b(d+c), when β=1, and A third multiplication hardware module 122 receiving value c and the output of the parametrizable addition/subtraction module 104 to supply the value c(a+b), when β=1.

The addition module 76 of the third level 102 receives the output of a multiplexer 124, controlled as a function of parameter β, supplying output a(d−c) of multiplication module 118 (β=1) or P0 (β=0), and the output of a multiplexer 126, controlled as a function of the value of parameter β, supplying output c(a+b) of multiplication module 122 (β=1) or the output Ref−a of the parametrizable addition/subtraction module 104 (β=0).

The parametrizable addition/subtraction module 86 of the third level 102 receives the output of a multiplexer 128, controlled as a function of parameter β, supplying output b(d+c) of multiplication module 120 (β=1) or the output Ref−b of subtraction module 108 (β=0), and the output of a multiplexer 130, controlled as a function of the value of parameter β, supplying output c(a+b) of multiplication module 122 (β=1) or P1 (β=0).

Lastly, the multiplexer 80 receives output data from module 76, that it supplies as output data when β=1, and also output data from subtraction module 110, that it supplies as output data when β=0, with multiplexer 90 receiving output from module 86, that it supplies as output data when β=1, and output from the parametrizable addition/subtraction module 114, that it supplies as output data to module 88 when β=0.

At the output of the third level 102, a first multiplexer 132 controlled by the output of subtraction module 82 selects the smaller of the two values furnished by modules 76 and 78 for the Viterbi computation to determine the value for Vit0, and a second multiplexer 134 controlled by the output of subtraction module 92 selects the smaller of the two values furnished by modules 86 and 88 also for the Viterbi computation to determine the value for Vit1.

It is clear that the data processor described previously can be configured with a simple binary parameter β to carry out FFT computations using input values a, b, c, d, e and f when β=1 and to perform computations of branch metrics, path metrics and survivors values for a Viterbi algorithm implementation using input values Ref, a, b, c, d, P0 and P1 when β=0. The shaded elements in the diagram of FIG. 8, i.e. 80, 84, 86, 90, 94, 104, 106, 112, 114, 116, 124, 126, 128, and 130, are those that can be parameterized using β.

While FFT and Viterbi algorithms are different both regarding the data they process and the functions they perform, pooling the subtraction and/or addition modules and conceiving a common structure for them is possible through the original exploitation of a similarity in functioning of butterfly operators that they implement.

As compared to a data processor with butterfly operator able to carry out solely FFT computations, it requires only the addition of the subtraction module 108 and all the multiplexers to move between the FFT mode and the Viterbi mode.

Thus, in comparing an FFT computation operator and an operator for computing branch metrics values and path metrics and survivors values for a Viterbi algorithm to an operator as described previously, the need for addition/subtraction operators is cut approximately in half.

The gain is even larger when considering that the FFT and Viterbi computations are generally not performed simultaneously.

Still as overall resources required for the two processing operations are different (with reference to current standards, FFT sizes vary between 64 and 2,048, which requires between 32 and 1,024 butterfly operators per trellis step, while the degrees of generator polynomials of convolutional codes vary between 4 and 8, which requires between 8 and 128 butterfly operators), supposing that only half of the FFT operators are implemented as described previously, then there are sufficient operators available to perform the Viterbi computations with a gain of 13% in terms of numbers of addition/subtraction hardware modules. With an even higher or total level of parallelism among Viterbi butterfly operators, it remains possible to achieve an improvement of around 50%.

Another advantage of this common structure is to be able to profit, in the Viterbi mode, by the fact that data processed in the FFT mode must be complex and that their real or imaginary parts are generally integer numbers. In the Viterbi mode the processor is then able to function as well with hard input data (binary) as with soft data (integers).

In view of the variability of microelectronics technologies performance, it is advantageous to offer the most consistent basic processors possible. In fact, it is conceivable to install extra processors of this kind and to configure them afterwards depending on performance or breakdowns experienced in each of the processors.

Figure 9:
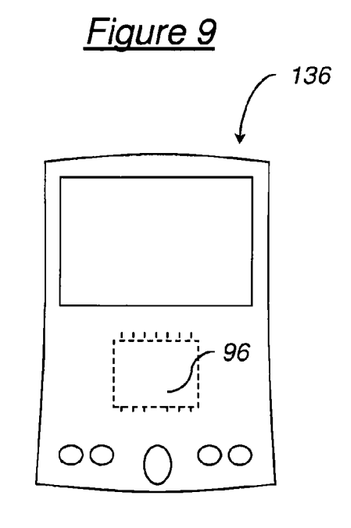
FIG. 9 is a schematic representation of the overall structure of a telecommunication terminal according to an embodiment of the invention.

Consequently, a processor for data processing 96 as previously described is advantageously integrated into a telecommunication terminal 136 with multi-carrier modulation/demodulation of both received and emitted signals and that can decode signals processed by a convolutional code as illustrated in FIG. 9.

The applications of this dual mode processor handling both FFT and Viterbi functions are multiple, for either single or multi-standard terminals. In fact, many standards implement an OFDM modulation for FFT computations and require decoding of a convolutional code by means of the Viterbi algorithm, including the following:
- Land-based DAB digital radio broadcasting,
- Land-based digital video broadcasting (DVB-T and DVB-H),
- Land-based DMB-T digital radio broadcasting,
- Land-based DRM digital radio broadcasting,
- Wired links: ADSL, VDSL, modem power line communications (Homeplug), modem cable (Docsis standard),
- Wireless networks based on the following standards: 802.11a, 802.11g (Wi-Fi), 802.16 (WiMAX) and HiperLAN,
- New generation 4G mobile networks.

Naturally, this list is non limitative, since the quasi-totality of current or in progress standards use OFDM modulation and/or Viterbi decoding processes.

Furthermore, recent work has shown that FFT could be applied in operations more diversified than a simple modulation. It can notably be used for correlation calculations, development of FIR filters, channel estimates or detection of several users. Likewise, use of the Viterbi algorithm has extended to decoding Turbo Codes.

Thus, the proposed common FFT/Viterbi architecture may be used by a majority of telecommunications terminal functions and is not restricted to only channel decoding and modulation/demodulation units.

It should be noted that the invention is not limited to the conceived embodiments. It will be clear to a person skilled in the art that diverse modifications may be made to the embodiment described above in view of the information here revealed. In the claims below, the terms used should not be interpreted as limiting the claims to the embodiments presented in this description, but should rather be interpreted to include herein all the equivalents that the claims seek to cover through their formulation and which can be anticipated by persons skilled in the art by applying their general knowledge to implementing the information here revealed.

The invention claimed is:

1. A processor for processing digital data, comprising:
at least one butterfly operator for the execution of a fast Fourier transform computation, the butterfly operator including a first stage of complex multiplication and a second stage of complex addition and subtraction that receives output data from the first stage, with each of the two stages containing a plurality of addition/subtraction hardware modules and data transmission links between the modules,
wherein the first stage of complex multiplication contains a first level of real addition/subtraction of input data, a second level of real multiplications carried out using data from the first level, and a third level of real addition/subtraction carried out using data from the second level, with at least a part of the addition/subtraction modules of the first level of the first stage of complex multiplication and at least a part of the links going to or leaving from the modules is configurable with the aid of at least one programmable parameter, between a first configuration in which the butterfly operator carries out said fast Fourier transform computation and a second configuration in which the butterfly operator carries out both a computation of branch metrics values and of path metrics and survivors values of a Viterbi algorithm, such that the processor is capable of operating in both of the first configuration and the second configuration and the processor is configured to switch between operating in the first configuration and the second configuration based on a value assigned to the at least one programmable parameter.

2. The processor for processing digital data according to claim 1, wherein in the first configuration the first level of the first stage of complex multiplication carries out prior addition and/or subtraction operations set up to limit the number of real multiplications to execute at the second level when the butterfly operator performs a fast Fourier transform computation.

3. The processor for processing digital data according to claim 2, wherein the first level of the first stage of complex multiplication contains four hardware modules for addition and/or subtraction, and the second level of the first stage of complex multiplication contains three hardware modules for real multiplication.

4. The processor for processing digital data according to claim 1, wherein configurable addition/subtraction modules can be configured using a single binary parameter between an adder configuration and a subtractor configuration for each of them, such that the processor is in the said first configuration of the fast Fourier transform computation by the butterfly operator when the single binary parameter takes one of its two possible binary values, and in the second said configuration of a computation of branch metrics values and of path metrics and survivors values by the butterfly operator when the single binary parameter takes the other of the two possible binary values.

5. The processor for processing digital data according to claim 4, wherein the configurable links contain dual input multiplexers with a single output and with a selection of one of the two inputs using the said single binary parameter.

6. The processor for processing digital data according to claim 1, further comprising:
   a first operator with three combined addition/subtraction modules that can be configured using at least one programmable parameter between a first configuration in which this first operator carries out computations of real parts of coefficients involved in the computation of a fast Fourier transform and a second configuration in which a first computation of branch metrics values and of path metrics and survivors values of a Viterbi algorithm is carried out; and
   a second operator, different from the first, with three combined addition/subtraction modules that can be configured using at least one programmable parameter between a first configuration in which this second operator carries out computations of imaginary parts of coefficients involved in the computation of a fast Fourier transform and a second configuration in which a second computation of branch metrics values and of path metrics and survivors values of a Viterbi algorithm is carried out.

7. The processor for processing digital data according to claim 1, further comprising:
   a plurality of butterfly operators that can be configured between the said first configuration in which each butterfly operator carries out the said fast Fourier transform and the said second configuration in which each butterfly operator carries out a computation of branch metrics values and of path metrics and survivors values of a Viterbi algorithm, the butterfly operators being structured among themselves such that they can perform a fast Fourier transform computation by means of a trellis structure Radix 2 Cooley-Tukey algorithmic approach, and for a trellis implementation of the Viterbi algorithm with four reference symbols.

8. A telecommunication terminal with multi-carrier modulation/demodulation of both received and emitted signals that decodes signals processed by means of a convolutional code, comprising:
   at least one processor for processing digital data, the at least one processor including
      at least one butterfly operator for the execution of a fast Fourier transform computation, the butterfly operator including a first stage of complex multiplication and a second stage of complex addition and subtraction that receives output data from the first stage, with each of the two stages containing a plurality of addition/subtraction hardware modules and data transmission links between the modules,
      wherein the first stage of complex multiplication contains a first level of real addition/subtraction of input data, a second level of real multiplications carried out using data from the first level, and a third level of real addition/subtraction carried out using data from the second level, with at least a part of the addition/subtraction modules of the first level of the first stage of complex multiplication and at least a part of the links going to or leaving from the modules are configurable with the aid of at least one programmable parameter, between a first configuration in which the butterfly operator carries out said fast Fourier transform computation and a second configuration in which the butterfly operator carries out both a computation of branch metrics values and of path metrics and survivors values of a Viterbi algorithm, such that the processor is capable of operating in both of the first configuration and the second configuration and the processor is configured to switch between operating in the first configuration and the second configuration based on a value assigned to the at least one programmable parameter.

9. The telecommunication terminal according to claim 8, wherein an OFDM modulation/demodulation is implemented.

10. The telecommunication terminal according to claim 9, of a multi-standards type, comprising at least one modulator/demodulator that implements an OFDM modulation and demodulation and that is compatible with each implemented standard, and at least one decoder of signals encoded by a convolutional code compatible with each implemented standard.

11. A method, implemented by a processor for processing digital data, the processor having at least one butterfly operator for the execution of a fast Fourier transform computation, the butterfly operator including a first stage of complex multiplication and a second stage of complex addition and subtraction that receives output data from the first stage, with each of the two stages containing a plurality of addition/subtraction hardware modules and data transmission links between the modules, wherein the first stage of complex multiplication contains a first level of real addition/subtraction of input data, a second level of real multiplications carried out using data from the first level, and a third level of real addition/subtraction carried out using data from the second level, with at least a part of the addition/subtraction modules of the first level of the first stage of complex multiplication and at least a part of the links going to or leaving from the modules are configurable with the aid of at least one programmable parameter, between a first configuration in which the butterfly operator carries out said fast Fourier transform computation and a second configuration in which the butterfly operator carries out both a computation of branch metrics values and of path metrics and survivors values of a Viterbi algorithm, such that the processor is capable of operating in both of the first configuration and the second configuration, the method comprising:
   switching the processor from operating in the first configuration to the second configuration, or from operating in the second configuration to the first configuration, by changing a value assigned to the at least one programmable parameter.

* * * * *